United States Patent
Petrick

[11] Patent Number: 5,856,746
[45] Date of Patent: Jan. 5, 1999

[54] LOGIC SPEED-UP BY SELECTING TRUE/FALSE COMBINATIONS WITH THE SLOWEST LOGIC SIGNAL

[75] Inventor: Bruce E. Petrick, Sunnyvale, Calif.

[73] Assignee: Sun Microsystems, Inc., Palo Alto, Calif.

[21] Appl. No.: 664,567

[22] Filed: Jun. 17, 1996

[51] Int. Cl.⁶ .................................................. H03K 19/01
[52] U.S. Cl. ................................ 326/17; 326/93; 327/407
[58] Field of Search ................................. 326/17, 21, 93, 326/98; 364/489–491; 327/407

[56] References Cited

U.S. PATENT DOCUMENTS

| | | |
|---|---|---|
| 4,940,908 | 7/1990 | Tran ....................................... 326/21 X |
| 4,970,507 | 11/1990 | Cooperman et al. .................. 326/17 X |
| 5,250,855 | 10/1993 | Asato ......................................... 326/17 |
| 5,592,103 | 1/1997 | Sutherland ............................... 326/17 |
| 5,638,290 | 6/1997 | Ginetti et al. ............................ 364/489 |
| 5,644,499 | 7/1997 | Ishii ......................................... 364/489 |
| 5,654,898 | 8/1997 | Roetcisoender et al. ............... 364/490 |

*Primary Examiner*—Jon Santamauro
*Attorney, Agent, or Firm*—Limbach & Limbach LLP

[57] ABSTRACT

A "slow" signal is not sent across chip to be combined with combinatorial logic, but rather, the logic with which it would be combined is partitioned such that there are two outputs, one if the "slow" signal would be true and a second if the "slow" signal would be false. Both of these outputs are then provided to a multiplexer. The original "slow" signal selects the correct signal, thus saving the interconnect time delay. The concepts also apply to combinations of multiple "slow" signals.

18 Claims, 4 Drawing Sheets

| B/A | SELECTS |
|-----|---------|
| 00  | C1      |
| 01  | C2      |
| 10  | C3      |
| 11  | C4      |

WHERE

LOGIC SPEED-UP BY SELECTING TRUE/ FALSE COMBINATIONS WITH THE SLOWEST LOGIC SIGNAL

BACKGROUND OF THE INVENTION

1. Field of the Invention

The present invention relates to semiconductor integrated circuit configurations and, in particular, to methods and circuitry for reducing interconnect time delays.

2. Discussion of the Related Art

Integrated circuits often include logic signals that must cross the chip or are used as inputs to a number of logic blocks physically located in different areas of the chip. Some of these signals are much slower than others. There are numerous cases in which a "slow" signal crosses a portion of the chip, is logically combined with other signals and then the result, i.e. the output of the combinatorial logic, is returned to the original logic block or sent to logic in a distant part of the chip. With this approach, the interconnect delay can be substantial.

SUMMARY OF THE INVENTION

In accordance with the present invention, a "slow" signal is not sent across the chip to be logically combined. Rather, the logic with which it would be combined is partitioned such that there are two outputs, one based on the "slow" signal being true and a second based on the "slow" signal being false. These two outputs are then provided to a multiplexing function. The original "slow" signal selects the correct output signal, thus saving the round trip time delay. The concepts of the invention are also applicable to combinations of multiple "slow" signals.

Other features and advantages of the present invention will become apparent and be appreciated by reference to the following detailed description which should be considered in conjunction with the accompanying drawings.

DETAILED DESCRIPTION OF THE INVENTION

Figure 1:
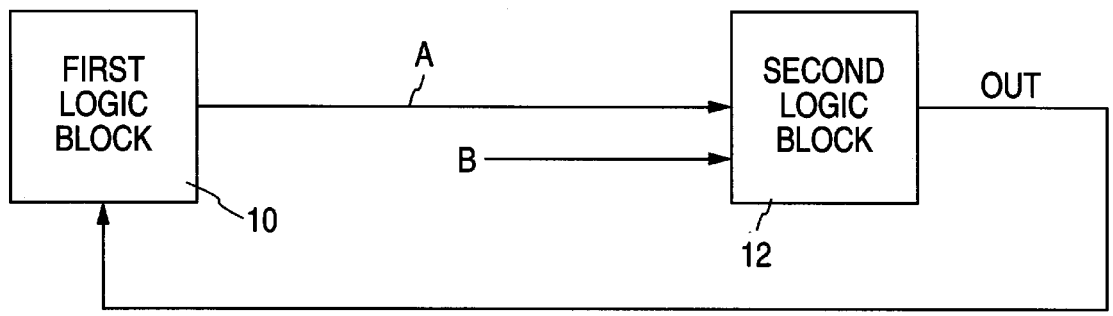
FIG. 1 is a block diagram illustrating a conventional integrated circuit that includes a first logic block that provides a "slow" output signal as an input to a second combinatorial logic block.
Figure 2:
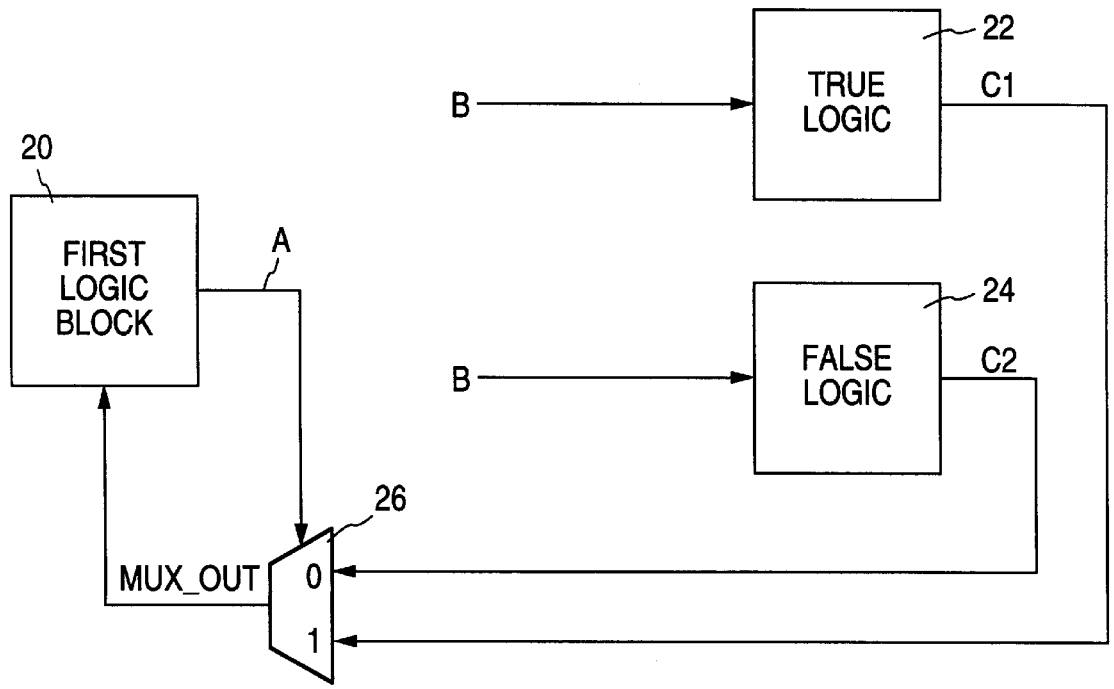
FIG. 2 is a block diagram illustrating circuitry that replaces the FIG. 1 "target" circuit and speeds up the operation of the FIG. 1 circuit, in accordance with the concepts of the present invention.

Referring to FIGS. 1 and 2, the concepts of the present invention will first be discussed in the context of the simplest example, i.e. the case in which a single slow signal A is provided to combinatorial logic that receives only one additional signal B as an input.

FIG. 1 shows portions of an integrated circuit that includes a first logic block 10 that generates an output signal A. The FIG. 1 circuit also includes a combinatorial logic block 12 that receives the output signal A from the first logic block and an additional signal B as inputs. The combinatorial logic block 12 is configured to generate as its output signal OUT a first combinatorial logic output signal C1 if signal A is in a "true" logic state and a second combinatorial logic output signal C2 if signal A is in a "false" logic state.

As discussed above, it is not uncommon for signal A to be relatively slow in traversing the circuit interconnects, particularly if the combinatorial logic block 12 is located in a part of the integrated circuit chip that is remote from the first logic block 10. Thus, the interconnect delay of signal A can adversely affect the speed of operation of the FIG. 1 circuit.

FIG. 2 shows speed-up circuitry that can be used to replace the FIG. 1 "target" circuitry, in accordance with the present invention. The FIG. 2 block diagram is representative of the fact that the combinatorial logic block 12 of the FIG. 1 circuit can be reduced to two logic blocks, one based on the assumption that signal A is true and one based on the assumption that signal A is false. That is, if one assumes that signal A is true, then it is a simple matter for one skilled in the art to create a logic circuit that generates signal C1 as an output based upon only signal B as an input. Similarly, if one assumes that signal A is false, then one skilled in the art can create a logic circuit that generates signal C2 as an output based upon only signal B as an input.

The FIG. 2 circuitry includes a first logic block 20, similar to the first logic block 10 of the FIG. 1 circuit, that generates output signal A. However, in the FIG. 2 circuit, the combinatorial logic block 12 of the FIG. 1 circuit is partitioned into a true logic block 22 and a false logic block 24. The true logic block 22 responds to the signal B by generating the first combinatorial logic output signal C1 that would result from operation of the FIG. 1 circuit if signal A were true. Similarly, the false logic block 24 responds to the signal B by generating the second combinatorial logic output signal C2 that would result from operation of the FIG. 1 circuit if signal A were false.

As further shown in FIG. 2, multiplexer circuitry 26 is connected to receive the first and second combinatorial logic output signals C1 and C2 respectively generated by the true and false logic circuitry 22 and 24. The output signal A generated by the first logic block 20 serves as the select signal for the multiplexer circuitry 26 such that the multiplexer circuitry 26 provides the first combinatorial logic output signal C1 as the multiplexer output signal MUX_OUT when signal A is in the true logic state ("1" in the FIG. 2 embodiment) and provides the second combinatorial logic output signal C2 as the multiplexer output signal when signal A is in the false logic state ("0" in the FIG. 2 embodiment).

In the FIG. 2 embodiment of the invention, the output MUX_OUT of the multiplexer circuitry 26 is provided as a further input signal to the first logic block 20. However, those skilled in the art will appreciate that this signal can be utilized anywhere on the chip or provided as a chip output.

Those skilled in the art will further appreciate that the multiplexer circuitry 26 can be implemented utilizing any of a number of well known logic configurations. In some cases, the utilization of AND/OR multiplexing logic will further enhance the speed of operation.

Figure 3:
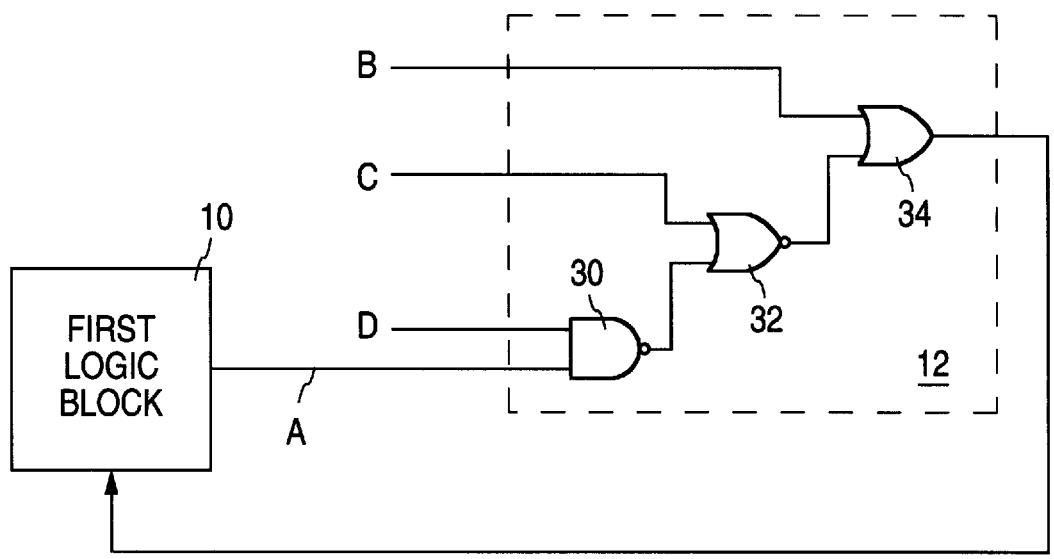
FIG. 3 is a logic diagram illustrating one possible embodiment of the FIG. 1 "target" circuit.
Figure 4:
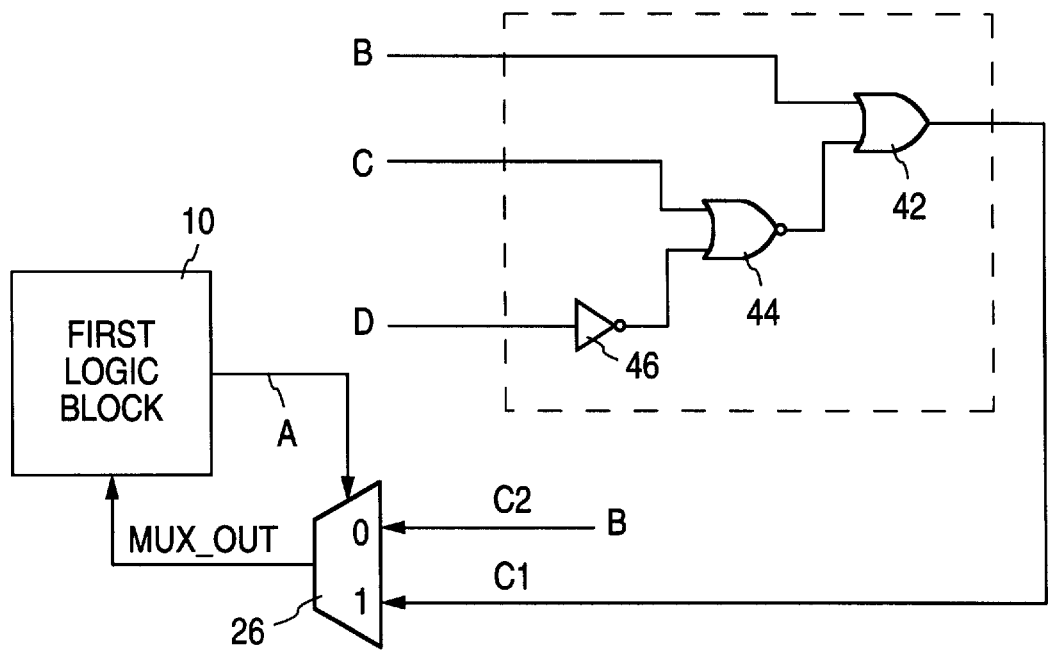
FIG. 4 is a logic diagram illustrating one possible embodiment of circuitry that replaces the FIG. 3 "target" circuit, in accordance with the concepts of the present invention.

FIGS. 3 and 4 provide a specific example of the implementation of the present invention.

FIG. 3 shows a simple logic configuration that corresponds to the FIG. 1 circuit. Specifically, the first logic block 10 provides the output signal A to a NAND gate 30 of combinatorial logic block 12. The NAND gate 30 also receives a signal D as an input. The output of the NAND gate 30 serves as a first input to a NOR gate 32. A signal C serves as a second input to the NOR gate 32. The output of the NOR gate 32 serves as a first input to an OR gate 34. Signal B serves as the second input to the OR gate 34. The OR gate 34 provides a first signal C1 as its output if signal A is true ("1") and provides a second signal C2 as its output if signal A is false ("0"). Analysis of the FIG. 3 circuit will show that when signal A is false (i.e. =0), then the output of OR gate 34 will be signal B.

As discussed above, if the propagation delay of signal A is great, then the speed of the overall integrated circuit that includes the FIG. 3 circuit is seriously compromised.

However, this problem is addressed by the FIG. 4 circuitry, in accordance with the concepts of the present invention. As discussed above with respect to the FIG. 2 circuit, the FIG. 3 "target" circuit is replaced by "true/false" logic for the true/false logic states of signal A.

As shown in FIG. 4, signal B is provided directly to the multiplexer circuitry 26 as signal C2, representing the case where signal A is false (i.e. =0). In addition, signal B serves as one input to an OR gate 42, an additional input to the OR gate 42 being provided by the output of a NOR gate 44. As further shown in FIG. 4, the inputs to the NOR gate 44 include signal C and the output of an inverter 46. A comparison of FIGS. 3 and 4 shows that the logic combination is the same except that the NAND gate 34 of the FIG. 3 circuit is replaced by the inverter 46 of the FIG. 4 circuit.

The output C1 of OR gate 42 is provided as an input to the multiplexer circuitry 26, a second input to the multiplexer circuitry 26 being provided directly by signal B. Signal A serves as the select signal for the multiplexer 26, passing signal C1 to the multiplexer output MUX_OUT if signal A is in a true logic state and passing signal C2 (i.e. signal B) to the multiplexer output MUX_OUT if signal A is in a false logic state.

Thus, the FIG. 4 circuit replaces the function of the FIG. 3 "target" circuit without the need to suffer the interconnect delays associated with providing signal A to the across-chip combinatorial logic.

Figure 5:
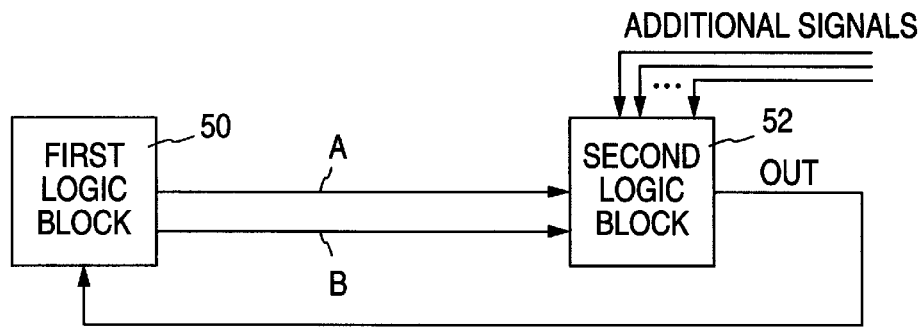
FIG. 5 is a block diagram illustrating a "target" integrated circuit that includes a first logic block that provides two "slow" output signals as inputs to a second combinatorial logic block.

FIG. 5 shows a "target" circuit wherein two "slow" signals, signal A and signal B, which in the illustrated embodiment are generated by a first logic block 50, are provided as inputs to a second combinatorial logic block 52. The combinatorial logic block 52 also receives additional signals as inputs. The output signal OUT of the combinatorial logic block 52 is provided as an input to the first logic block 50.

Those skilled in the art will appreciate that, based on variations the digital true/false state of the two inputs A and B, combinatorial logic block 52 will generate four possible outputs: signals C1, C2, C3, and C4.

Figure 6:
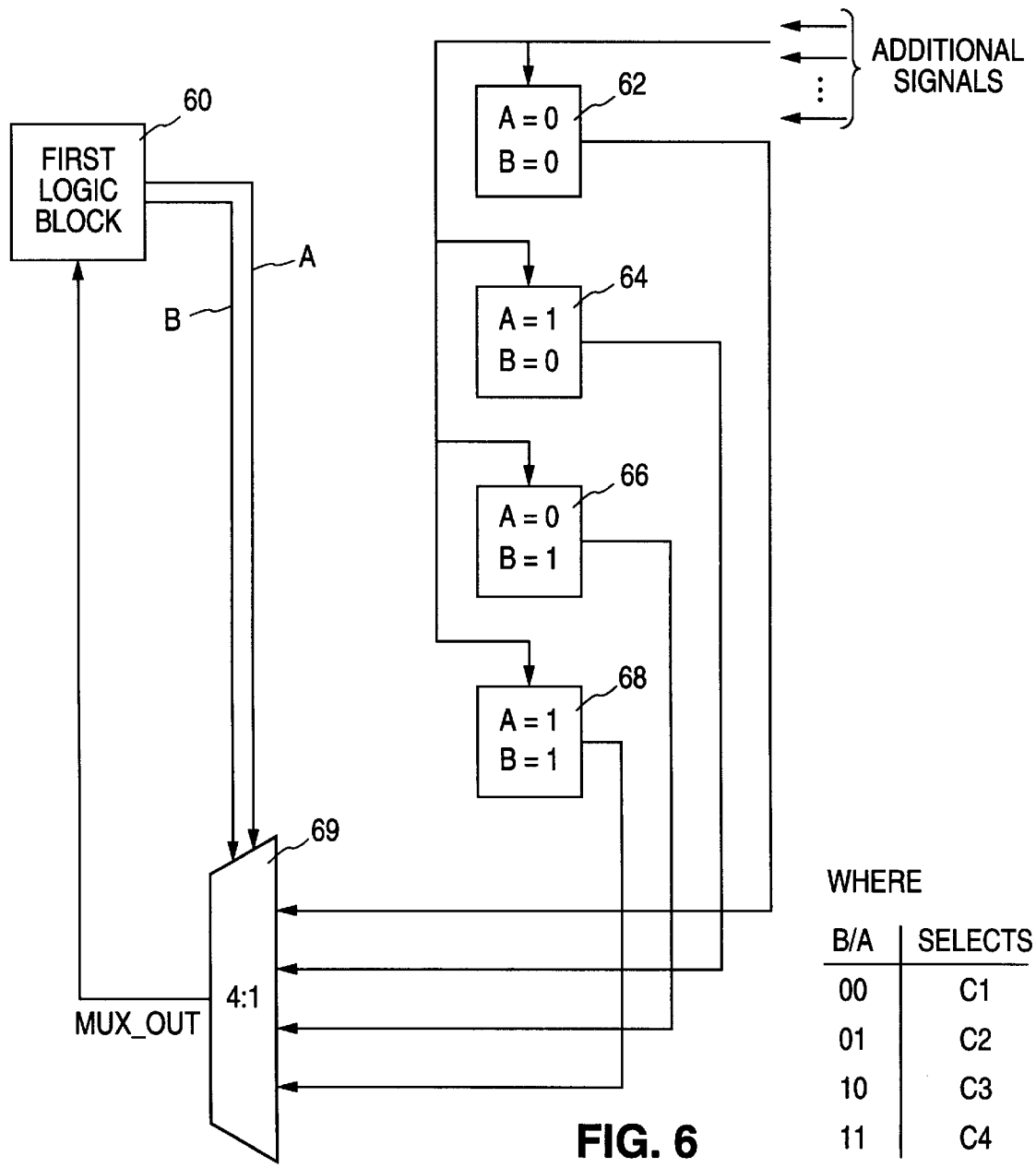
FIG. 6 is a block diagram illustrating circuitry that replaces the FIG. 5 "target" circuit and speeds up operation of the FIG. 5 circuit, in accordance with the concepts of the present invention.

Referring to FIG. 6, in accordance with the concepts of the present invention, the FIG. 5 "target" circuit is replaced by four logic blocks 62, 64, 66, 68, each one based on the assumption that the A/B signal combination generated by the first logic block 60 is one of the four possible values (A=0, B=0; A=1, B=0, A=0, B=1 and A=1, B=1) that generates a corresponding output C1, C2, C3, C4 in the operation of the FIG. 5 circuit. Specifically, logic block 62 is created, assuming that A=0 and B=0, to generate output signal C1 based upon only the additional input signals. Logic block 64 is created, assuming that A=1 and B=0, to generate output signal C2 based upon only the additional input signals. Similarly, logic block 66 is created to generate output signal C3, assuming that A=0 and B=1, and logic block 68 is created to generate output signal C4, assuming that A=1 and B=1.

As further shown in FIG. 6, the four signals C1, C2, C3 and C4 are provided as inputs to 4:1 multiplexer circuitry 69. The four A/B signal combinations provide the select signal for the multiplexer 69. The multiplexer output signal MUX-OUT is provided to the first logic block 60.

Applying the FIG. 6 concepts to the "target" logic shown in FIG. 3, signals A and B in FIG. 3 may be considered the "slow" signals while signals C and D may be considered the additional signals.

Figure 7:
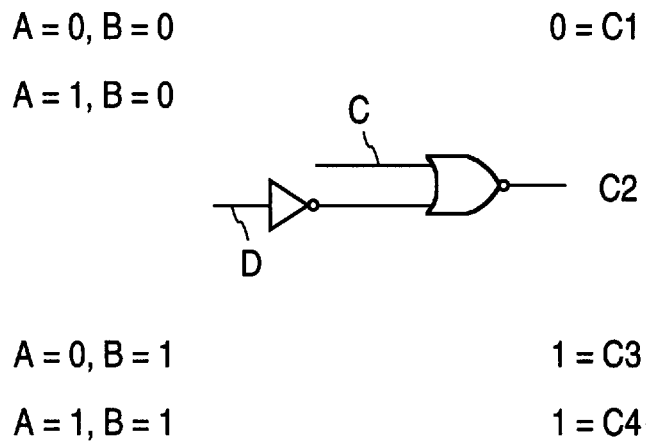
FIG. 7 provides a table illustrating application of the FIG. 6 concepts as applied to the "target" logic shown in FIG. 3.

As shown in FIG. 7, when A=0 and B=0, the FIG. 3 logic generates signal C1=0. When A=1 and B=0, the FIG. 3 logic may be replaced by the logic shown in FIG. 7 to generate signal C2. When A=0 and B=1, the FIG. 3 logic generates signal C3=1. When A=1 and B=1, the FIG. 3 logic generates signal C4=1.

Figure 8:
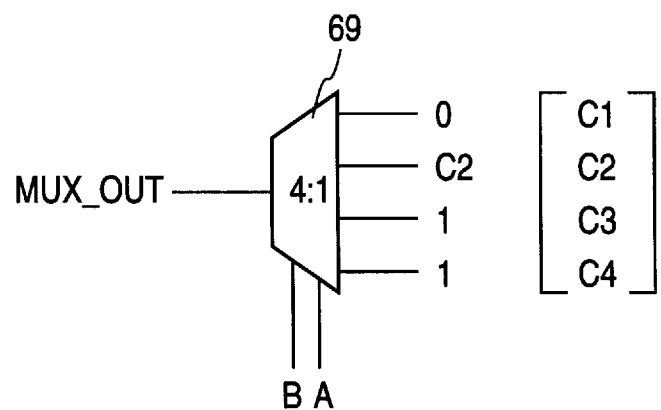
FIG. 8 shows 4:1 multiplexer circuitry as utilized to implement the FIG. 6 concepts as applied to the FIG. 3 "target" logic.

As shown in FIG. 8, in this example, the 4:1 mux 69 selects the correct version of the FIG. 3 output.

Those skilled in the art will appreciate that if three "slow" signals are used, then $8=2^3$ replacement logic circuits and an 8:1 multiplexer circuitry are required to replace the "target" circuit. In general, for N "slow" signals, $2^N$ replacements logic circuits and $2^N:1$ multiplexer circuitry are required.

It should be understood that various alternatives to the embodiments of the invention described herein may be employed in practicing the invention. It is intended that the following claims define the scope of the invention and that methods and circuits within the scope of these claims and their equivalents be covered thereby.

What is claimed is:

1. Speed-up circuitry for speeding up the operation of a target integrated circuit, wherein the target integrated circuit includes a combinatorial logic block that receives a first signal and a plurality of additional signals as inputs to the combinatorial logic block, the combinatorial logic block being configured to generate a first combinatorial logic output signal if the first signal is in a true logic state and a second combinatorial logic output signal if the first signal is in a false logic state, the speed-up circuitry comprising:

true logic circuitry that responds to only the additional signals by generating the first combinatorial logic output signal;

false logic circuitry that responds to only the same additional signals provided to the true logic circuitry by generating the second combinatorial logic output signal; and multiplexer circuitry connected to receive the first and second combinatorial logic output signals, respectively generated by the true and false logic circuitry, as inputs, and further connected to receive the first signal as a select signal such that the multiplexer circuitry provides the first combinatorial logic output signal as a multiplexer output signal when the first signal is in the true logic state and provides the second combinatorial logic output signal as the multiplexer output signal when the first signal is in the false logic state, and wherein the first signal is generated by a first logic block and the multiplexer output signal is provided as an input signal to the first logic block.

2. Speed-up circuitry as in claim 1 and wherein the first signal is delayed compared to the plurality of additional signals.

3. Speed-up circuitry as in claim 1 and wherein the first signal is delayed by interconnect delay compared to the plurality of additional signals.

4. Speed-up circuitry for speeding up the operation of a target integrated circuit, wherein the target integrated circuit includes a combinatorial logic block that receives a first signal and a plurality of additional signals as inputs to the combinatorial logic block, the combinatorial logic block being configured to generate a first combinatorial logic output signal if the first signal is in a true logic state and a second combinatorial logic output signal if the first signal is in a false logic state, the speed-up circuitry comprising:

true logic circuitry that responds to only the additional signals by generating the first combinatorial logic output signal;

false logic circuitry that responds to only the same additional signals provided to the true logic circuitry by generating the second combinatorial logic output signal; and multiplexer circuitry connected to receive the first and second combinatorial logic output signals, respectively generated by the true and false logic circuitry, as inputs, and further connected to receive the first signal as a select signal such that the multiplexer circuitry provides the first combinatorial logic output signal as a multiplexer output signal when the first signal is in the true logic state and provides the second combinatorial logic output signal as the multiplexer output signal when the first signal is in the false logic state, and wherein the first signal is generated by a first logic block and the multiplexer output signal is provided as an input signal to a logic block different from the first logic block.

5. Speed-up circuitry as in claim 4 and wherein the first signal is delayed compared to the plurality of additional signals.

6. Speed-up circuitry as in claim 4 and wherein the first signal is delayed by interconnect delay compared to the plurality of additional signals.

7. A method of speeding up the operation of a target integrated circuit, wherein the target integrated circuit includes a combinatorial logic block that receives a first signal and a plurality of additional signals as inputs to the combinatorial logic block, the combinatorial logic block being configured to generate a first combinatorial logic output signal if the first signal is in a true logic state and a second combinatorial logic output signal if the first signal is in a false logic state, the method comprising:

utilizing true logic circuitry to respond to only the additional signals by generating the first combinatorial logic output signal;

utilizing false logic circuitry to respond to only the same additional signals provided to the true logic circuitry by generating a second combinatorial logic output signal; and providing the first combinatorial logic output signal as an output signal when the first signal is in the true logic state and providing the second combinatorial logic output signal as the output signal when the first signal is in the false logic state, and wherein the first signal is generated by a first logic block and comprising the further step of providing the output signal as an input signal to the first logic block.

8. A method as in claim 7 and wherein the first signal is delayed compared to the plurality of additional signals.

9. A method as in claim 7 and wherein the first signal is delayed by interconnect delay compared to the plurality of additional signals.

10. A method of speeding up the operation of a target integrated circuit, wherein the target integrated circuit includes a combinatorial logic block that receives a first signal and a plurality of additional signals as inputs to the combinatorial logic block, the combinatorial logic block being configured to generate a first combinatorial logic output signal if the first signal is in a true logic state and a second combinatorial logic output signal if the first signal is in a false logic state, the method comprising:

utilizing true logic circuitry to respond to only the additional signals by generating the first combinatorial logic output signal;

utilizing false logic circuitry to respond to only the same additional signals provided to the true logic circuitry by generating a second combinatorial logic output signal; and providing the first combinatorial logic output signal as an output signal when the first signal is in the true logic state and providing the second combinatorial logic output signal as the output signal when the first signal is in the false logic state, and wherein the first signal is generated by a first logic block and comprising the further step of providing the output signal to a logic block different from the first logic block.

11. A method as in claim 10 and wherein the first signal is delayed compared to the plurality of additional signals.

12. A method as in claim 10 and wherein the first signal is delayed by interconnect delay compared to the plurality of additional signals.

13. Speed-up circuitry for speeding up the operation of a target integrated circuit, wherein the target integrated circuit includes N signals, where N is an integer greater than 1, the integrated circuit further including a combinatorial logic block that receives the N signals and a plurality of additional signals as inputs to the combinatorial logic block, the combinatorial logic block configured to generate $2^N$ output signals, each one of the $2^N$ output signals corresponding to one of $2^N$ digital combinations of the N signals, the speed-up circuitry comprising:

$2^N$ logic circuits, each of the $2^N$ logic circuits configured to respond to only the additional signals to generate one of the $2^N$ output signals that corresponds to one of the $2^N$ digital combinations of the N signals; and $2^N$:1 multiplexer circuitry that receives the $2^N$ output signals generated by the $2^N$ logic circuits, the N signals connected to provide a select signal to the multiplexer circuitry whereby the multiplexer circuitry provides as a multiplexer output the one of the $2^N$ output signals corresponding to the digital value of the select signal.

14. A method as in claim 13 and wherein the N signals are delayed compared to the additional signals.

15. A method as in claim 13 and wherein the N signals are delayed by interconnect delay compared to the additional signals.

16. A method for speeding up the operation of a target integrated circuit, wherein the target integrated circuit includes N signals, where N is an integer greater than 1, the integrated circuit further including a combinatorial logic block that receives the N signals and a plurality of additional signals as inputs to the combinatorial logic block, the combinatorial logic block configured to generate $2^N$ output signals, each one of the $2^N$ output signals corresponding to one of $2^N$ digital combinations of the N signals, the method comprising:

utilizing $2^N$ logic circuits, each of the $2^N$ logic circuits configured to respond to only the additional signals, to generate the $2^N$ output signals that correspond to the $2^N$ digital combinations of the N signals;

providing the N signals as a select signal to $2^N$:1 multiplexer circuitry that receives the $2^N$ output signals; and utilizing the N signals to provide as a multiplexer output the one of the $2^N$ output signals corresponding to the select signal.

17. A method as in claim 16 and wherein the N signals are delayed compared to the additional signals.

18. A method as in claim 16 and wherein the N signals are delayed by interconnect delay compared to the additional signals.

\* \* \* \* \*